United States Patent [19]
Hayashi

[11] Patent Number: 5,650,756
[45] Date of Patent: Jul. 22, 1997

[54] HIGH FREQUENCY SIGNAL DIVIDING AND/OR COMBINING DEVICE

[75] Inventor: Katuhiko Hayashi, Tokyo, Japan

[73] Assignee: TDK Corporation, Tokyo, Japan

[21] Appl. No.: 605,213

[22] PCT Filed: Oct. 3, 1994

[86] PCT No.: PCT/JP94/01651

§ 371 Date: Apr. 29, 1996

§ 102(e) Date: Apr. 29, 1996

[87] PCT Pub. No.: WO95/10118

PCT Pub. Date: Apr. 13, 1995

[30] Foreign Application Priority Data

Oct. 4, 1993 [JP] Japan .................................. 5-247958

[51] Int. Cl.$^6$ ..................................................... H03H 7/48
[52] U.S. Cl. .......................... 333/100; 333/118; 333/124
[58] Field of Search ..................................... 333/100, 112, 333/118, 124, 128, 136

[56] References Cited

U.S. PATENT DOCUMENTS

| | | | |
|---|---|---|---|
| 5,382,925 | 1/1995 | Hayashi | 333/12 |
| 5,430,418 | 7/1995 | Blodgett | 333/100 |

FOREIGN PATENT DOCUMENTS

| | | |
|---|---|---|
| 0 585 469 A1 | 3/1994 | European Pat. Off. . |
| 4-207806 | 7/1992 | Japan . |
| 4-355902 | 12/1992 | Japan . |
| 5-167374 | 7/1993 | Japan . |
| 5-66921 | 9/1993 | Japan . |
| WO95/10118 | 4/1995 | WIPO . |

OTHER PUBLICATIONS

Fundamentals and Applications of Microwave Circuits (Sogo–Denshi Shu–pan Sha) Chapter 4, pp. 205–210.

*Primary Examiner*—Paul Gensler
*Attorney, Agent, or Firm*—Frishauf, Holtz, Goodman, Langer & Chick, P.C.

[57] ABSTRACT

A high frequency signal dividing and/or combining device includes a circuit formed in a laminated sintered dielectric block, input and output terminals grounded through input and output grounding capacitors respectively, inductors (coils) and a resistor. The coil is formed in a coil section having at least one dielectric layer with a conductive coil pattern. The capacitors are formed in at least three dielectric layers including base, intermediate, and upper dielectric layers. The base dielectric layer includes a grounding electrode pattern providing a common grounding electrode for the input and output grounding capacitors. The intermediate dielectric layer overlaps the base dielectric layer so as to cover the grounding electrode pattern. The intermediate dielectric layer is formed with a pair of output capacitor electrode patterns of similar configuration for providing electrodes of the pair of output grounding capacitors, and an input capacitor electrode pattern for providing an electrode of the input grounding capacitor. The upper dielectric layer is laid over the intermediate dielectric layer to cover the capacitor electrode patterns. The upper dielectric layer is formed at a position opposing the output capacitor electrode patterns on the intermediate layer, and at a position opposing the input capacitor electrode pattern on the intermediate dielectric layer. The coil section and the capacitor section are laid one over the other and sintered to provide an integral block.

15 Claims, 12 Drawing Sheets

સ્ત્ર,650,756

HIGH FREQUENCY SIGNAL DIVIDING AND/OR COMBINING DEVICE

TECHNICAL FIELD

The present invention relates to a high frequency signal dividing and/or coupling device. More specifically, the present invention pertains to a high frequency signal dividing and/or coupling device adapted to be used in portable or cordless telephones, other telecommunication equipments, or various types of other electronic devices for dividing or coupling high frequency signals. Particularly, the present invention relates to a high frequency signal dividing and/or coupling device constructed in the form of a laminated structure of dielectric material.

BACKGROUND ART

As a circuit for dividing or coupling high frequency signals, those of a type proposed by E. J. Wilkinson have been known. The circuit includes an input terminal which is grounded through a grounding capacitor, and a pair of output terminals connected respectively through coils with the input terminal. Each of the output terminals is grounded through a grounding capacitor. A balancing capacitor and a resistor are connected in parallel with each other between the pair of output terminals. The high frequency signal dividing and/or coupling device is used to divide a high frequency signal applied to the input terminal into two high frequency signals of the same level and the same phase. The divided high frequency signals are produced in the pair of output terminals. When high frequency signals are applied to the respective ones of the output terminals, it is possible to obtain at the input terminal a high frequency signal which is produced by coupling the high frequency signals applied to the output terminals. Thus, when the high frequency signal dividing and/or coupling device is used for coupling signals, the input terminal functions as an output terminal and the output terminals function as input terminals.

Conventionally, it has been known to form high frequency circuits having coils and/or capacitors from sintered materials. In the conventional process, a green sheet of a dielectric material is provided with patterns of coils and/or capacitors by printing or coating thereon a conductive material, and a plurality of such green sheets are laid sequentially one over the other to form a block which is then subjected to a sintering process under a predetermined sintering temperature to provide a desired high frequency circuit of a sintered integral structure. An example of such process for producing a high frequency circuit is disclosed by the Japanese Laid-Open Patent No. Hei 4-355902.

It should however be noted that several problems are encountered when efforts are made to form the aforementioned high frequency signal dividing and/or coupling device with the known laminated structure. For example, a plurality of layers in the laminate have to be provided with patterns of capacitor electrodes for forming three input and output capacitors and a balancing capacitor between the output terminals as well as patterns for grounding electrodes. In this structure, there may be produced unexpected capacities which may be called as floating capacities between the capacitor electrodes and the grounding electrodes. The floating capacities can cause an imbalance between the paired output grounding capacitors so that the two outputs may have unequal impedance. As a result, there may be produced a difference in the level of the two output terminals thereby making it impossible to divide the output with equal levels. It is extremely difficult to eliminate the difference in level between the output terminals simply by appropriate design of arrangements of the capacitor electrodes.

It should further be noted that when the signal dividing and/or coupling device is to be designed for use in a very high frequency range such as above 1 GHz the output grounding capacitors have to be of a very small capacitance such as less than 0.5 pF. Such small capacitance is apt to be affected by floating capacitances caused for example by wiring so that it is difficult to determine the capacitance by an appropriate design of patterns. In the case of a circuit of a laminated structure, capacitance must be adjusted between each adjacent layer, however, difficulties arise in that any deviation in the layer thickness can affect the capacitance. The balancing capacitor between the paired output terminals has an influence on the isolation between the two outputs. It should be noted that when it is desired to provide a high isolation between the outputs the frequency at the center of the isolation can easily be shifted by a deviation in the thickness of the layer.

OBJECTS OF THE INVENTION

The present invention has an object to solve the aforementioned problems which may be encountered in forming the high frequency signal dividing and/or coupling device with a laminated structure.

Another object of the present invention is to provide a structure which can decrease as much as possible the influence of floating capacitance caused by electrodes formed in respective layers in producing a high frequency signal dividing and/or coupling device with a laminated structure of a dielectric material.

A further object of the present invention is to provide a laminated structure with a layout of electrode patterns which can be used to produce readily and stably a high frequency signal dividing and/or coupling device of a superior property.

In order to accomplish the above objects, the high frequency signal dividing and/or coupling device in accordance with one aspect of the present invention includes at least an input terminal grounded through an input capacitor, a pair of output terminals respectively grounded through output grounding capacitors, a coil connected between the input terminal and each of the output terminals, and a balancing capacitor connected with the pair of output terminals, which are formed in a laminated dielectric block. The coil is made in the form of a coil section having at least one layer of dielectric material with a coil pattern provided thereon. The capacitors are provided in the form of a capacitor section comprising a base dielectric layer having a pattern of grounding electrode for providing a grounding electrode which is common to both the input and output grounding capacitors, an intermediate dielectric layer placed over the base dielectric layer to cover the grounding electrode pattern and having a pair of output capacitor electrode patterns of identical configuration for providing electrodes of the pair of output grounding capacitors and an input capacitor electrode pattern for providing an electrode of the input grounding capacitor which are formed on the intermediate dielectric layer to be opposed to the grounding electrode pattern on the base dielectric layer, and an upper dielectric layer placed over the intermediate dielectric layer to cover the capacitor electrode patterns and having first and second balancing capacitor electrode patterns of identical configuration formed thereon to be opposed to the output electrode patterns on the intermediate dielectric layer for providing two separated electrodes of the balancing capacitor and a grounding electrode pattern formed to be opposed to the input capacitor pattern on the intermediate dielectric layer for providing a second grounding electrode. The coil section and the capacitor section are laid one over the other and sintered to provide a block of an integral structure.

The pair of output capacitor electrode patterns of the identical configuration formed on the intermediate dielectric layer are respectively connected with a pair of output terminals which are formed on an outer surface of the block. The input capacitor electrode pattern on the intermediate dielectric layer is connected with an input terminal formed on an outer surface of the block. The two separated first and second balancing capacitor patterns formed on the upper dielectric layer are connected with the output capacitor electrode patterns which are not opposed to the respective ones of the balancing capacitor patterns. The grounding electrode patterns on the base dielectric and upper dielectric layers are both connected with a grounding electrode on an outer surface of the block.

According to a preferable aspect of the present invention, the first and second balancing capacitor electrode patterns on the upper dielectric layer are of a size smaller than the output capacitor electrode patterns on the intermediate dielectric layer to which the balancing capacitor electrode patterns are opposed so that the balancing capacitor electrode patterns do not extend beyond the regions of the output capacitor electrode patterns.

In the structure in accordance with this aspect of the present invention, the pair of output grounding capacitors are formed between the output capacitor electrode patterns of the identical configuration formed on the intermediate dielectric layer and the grounding electrode pattern formed on the base dielectric layer. The input grounding capacitor is formed between the input capacitor electrode pattern on the intermediate dielectric layer and the grounding electrode patterns on the base and upper dielectric layers. The balancing capacitor is composed of a part of the capacitance formed between one of the output capacitor electrode patterns on the intermediate dielectric layer and one of the balancing capacitor electrode patterns on the upper dielectric layer and the remaining part of the capacitance formed between the other of the output capacitor electrode patterns on the intermediate dielectric layer and the other of the balancing capacitor electrode patterns on the upper dielectric layer. According to a preferable aspect, the capacitance of the balancing capacitor is divided into two equal parts, half of the capacitance being formed by one pair of opposing electrodes and remaining half of the capacitance being formed by another pair of opposing electrodes. For the purpose, the two separated first and second balancing capacitor patterns on the upper dielectric layer are made to possess identical configurations and arranged symmetrically with respect to a center line of the upper dielectric layer.

In the structure in accordance with the aforementioned preferable aspect of the present invention wherein the two separated first and second balancing capacitor electrode patterns on the upper dielectric layer are of a size smaller than the opposing output capacitor electrode patterns on the intermediate dielectric layer, there is no risk that a floating capacitance is produced between the balancing capacitor electrode patterns and the grounding electrode on the base dielectric layer.

In this type of high frequency signal dividing and/or coupling device, a resistor is connected between the pair of output terminals. It is preferable that the resistor between the output terminals is provided on the outer surface of the block to bridge the output terminals. Alternatively, it may be recommendable that the resistor is provided separately from the dielectric block to be mounted on the block and connected with the paired output terminals. When preferred, it is of course possible to form the resistor on an appropriate layer in the dielectric block.

In another aspect of the present invention, the high frequency signal dividing and/or coupling device has a capacitor section formed in at least four layers. The base dielectric layer has a grounding electrode pattern and there is placed on the grounding electrode pattern a first intermediate dielectric layer which has an input capacitor electrode for forming an electrode of an input grounding capacitor in a position to be opposed to a portion of the input capacitor electrode pattern. There is further provided above the first intermediate dielectric layer a second dielectric layer which is formed at a position opposing to the input capacitor electrode pattern with a second grounding electrode pattern of a size larger than the input capacitor electrode pattern and at a position which is not aligned with the input capacitor electrode pattern with an output capacitor electrode pattern for providing an electrode for one output grounding capacitor. Overlaid on the second intermediate layer is an upper dielectric layer which is formed at a position aligned with the output capacitor electrode pattern on the second intermediate dielectric layer with a second output capacitor electrode for forming an electrode for the other output grounding capacitor.

In this structure, the second output capacitor electrode pattern on the upper dielectric layer is formed with a size larger than the output capacitor electrode pattern on the second intermediate dielectric layer. In this instance, one of the output grounding capacitor is provided between the output capacitor electrode pattern on the second intermediate dielectric layer and the grounding electrode pattern on the base dielectric layer, and the other output grounding capacitor is provided between a portion of the second output capacitor electrode pattern on the upper dielectric layer extending beyond the region of the output capacitor electrode pattern on the second intermediate dielectric layer and the grounding electrode pattern on the base dielectric layer. The balancing capacitor is formed between the output capacitor electrode pattern on the second intermediate dielectric layer and the second output capacitor electrode pattern on the upper dielectric layer. In this structure, it is preferable to appropriately determine the sizes of the two output capacitor electrode pattern and the thicknesses of the first and second intermediate dielectric layers and the upper dielectric layer so that the two output grounding capacitors have equal capacitance.

It is possible to provide a pair of balancing capacitor electrode patterns respectively on the outer surface of the sintered laminated block of an integral structure and an inner dielectric layer for forming a portion of the balancing capacitance. The balancing capacitor electrode patterns are then connected with output terminals to thereby form as a whole together with other balancing capacitor positions formed in the block the balancing capacitor. In this instance, it is possible to adjust the capacitance of the balancing capacitor by appropriately trimming the capacitor electrode pattern formed on the outer surface of the laminated block.

As required, the electrode patterns for the aforementioned coil section and the electrode patterns for the capacitor section may be composed of a plurality of stages having a plurality of such sections. In this instance, it is possible to form a plurality of sets of coil patterns on a single dielectric layer and a plurality of sets of capacitor electrode patterns on a single dielectric layer. With this structure having a plurality of stages, it is possible to improve the isolation characteristics.

In the structures described above, the term "input" or "input side" and "output" or "output side" are used to mean that they function as the input side and the output side, respectively, when the device of the present invention is used as a signal divider so that they are not intended to limit the direction of the input and the output.

Embodiments of the present invention will now be described with reference to the drawings.

BEST MODE FOR EMBODYING THE INVENTION

Figure 1:
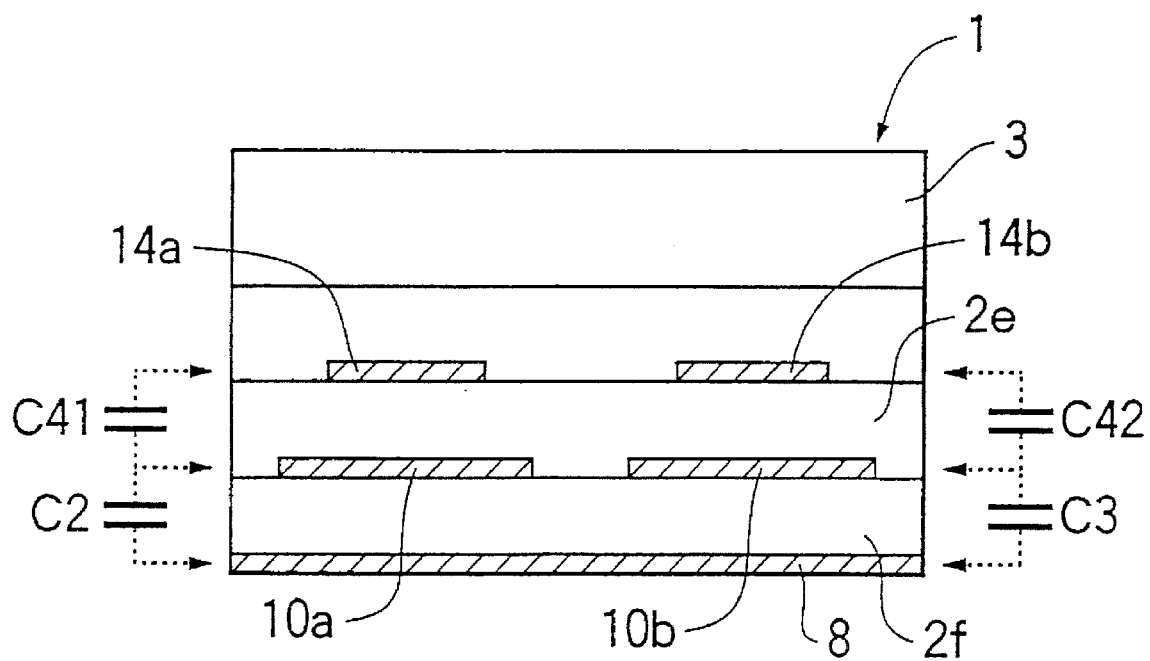
FIG. 1 is a sectional view of a high frequency signal dividing and/or coupling device in accordance with one embodiment of the present invention.
Figure 2:
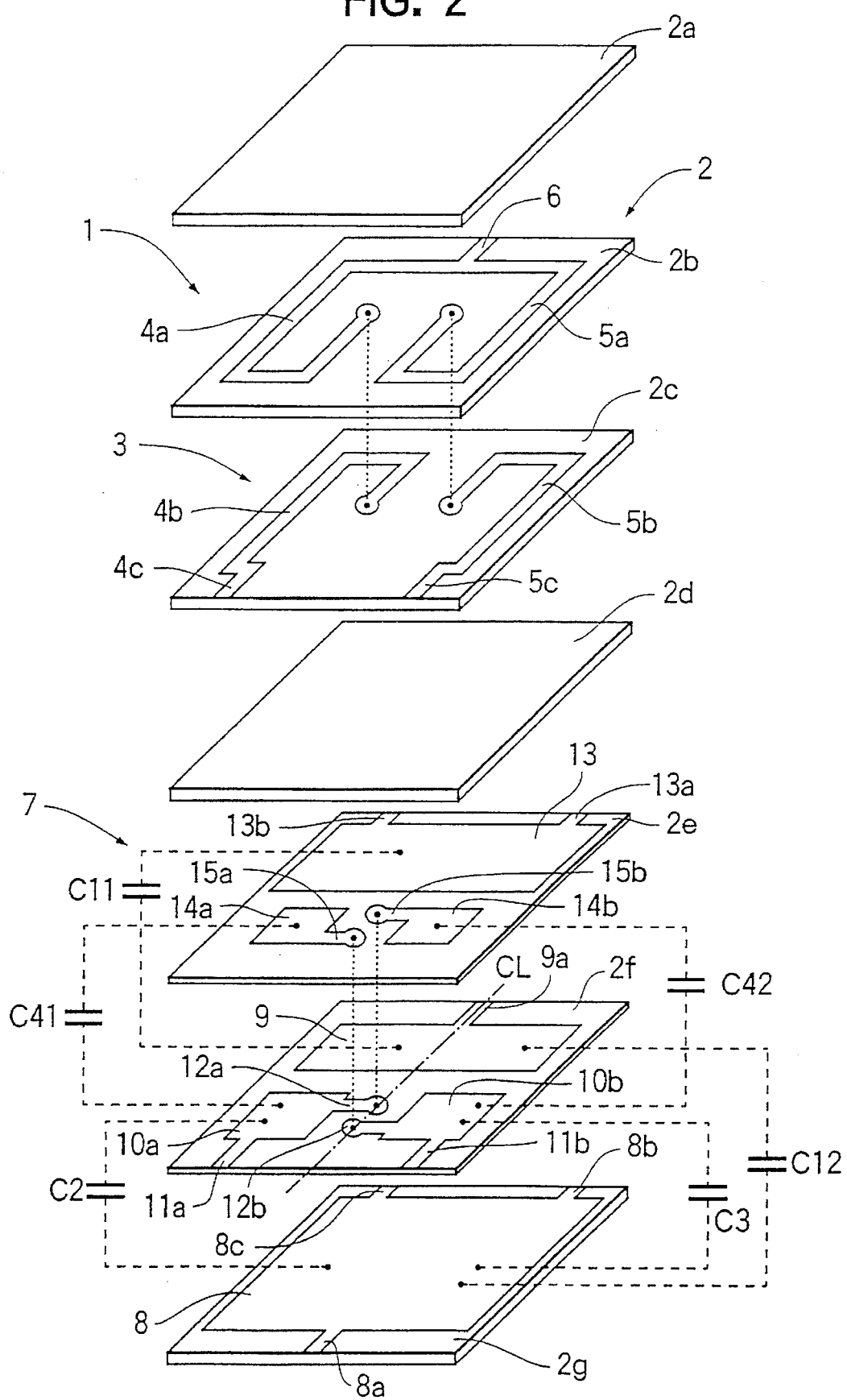
FIG. 2 is an exploded perspective view showing details of the structure of the embodiment shown in FIG.

Referring to the drawings, particularly to FIGS. 1 and 2, the high frequency signal dividing and/or coupling device in accordance with one embodiment of the present invention uses as described in the Japanese Laid-Open Patent Application No. Hei 4-355902 materials for forming dielectric layers which are in the form of green sheets each prepared by a paste comprising a mixture of particles of a ceramic material and glass frits added with vehicle such as a binder and/or solvent. The details of the material forming the green sheets will not be discussed herein because they are described in detail in the aforementioned patent application.

In the embodiment being described, the dividing and/or coupling device is comprised of seven layers 2 which include dielectric layers 2a, 2b, 2c, 2d, 2e, 2f and 2g. The second layer 2b and the third layer 2c provide a coil section 3. The second layer 2b is formed at the upper surface with coil portions 4a and 5a which provide upper halves of paired coils 4a, 4b and 5a, 5b. The coil portions 4a and 5a are connected with each other at one of their ends, the connection being provided with an input terminal connection lead 6 extending to an edge portion of the layer 2b. The third layer 2c is formed at the upper surface with coil portions 4b and 5b respectively providing lower halves of the coils 4 and 5. The coil portions 4b and 5b are connected at one of their ends with the coil portions 4a and 5a on the second layer 2b. The other ends of the coil portions 4b and 5b extend to an edge portion of the dielectric layer 2c to provide output terminal connection leads 4c and 5c.

The coil portions 4a, 4b, 5a and 5b form coil patterns and are provided on the dielectric layers 2b and 2c in a manner as described in the aforementioned patent application. Above the dielectric layer 2b, there is provided a cover or a dielectric layer 2a.

The dielectric layers 2e, 2f and 2g provide a capacitor section 7, wherein the lowermost base dielectric layer 2g is formed with a grounding electrode 8 extending throughout the surface. The grounding electrode 8 is formed with external connection leads 8a, 8b and 8c extending to an edge of the base dielectric layer 2g. The dielectric layer 2f located above the dielectric layer 2g is formed on the upper surface at a position opposing to the grounding electrode 8 with an input capacitor electrode 9 to extend in an area which is smaller than one half of the area of the dielectric layer 2g. The input capacitor electrode 9 has an input terminal connection lead 9a formed to be vertically aligned with the input terminal connection lead 6 on the dielectric layer 2b and extending to an edge portion of the layer 2f. The dielectric layer 2f has found thereon a pair of output capacitor electrodes 10a and 10b. The electrodes 10a and 10b have major portions which are identical in configuration with each other and located on the dielectric layer 2f symmetrically with respect to a center line CL of the plane of the dielectric layer.

A pair of output terminal connections leads 11a and 11b are formed to extend from the output capacitor electrodes 10a and 10b to an edge portion of the dielectric layer 2f. These output terminal connection leads 11a and 11b are located in positions vertically aligned with the output terminal connection leads 4c and 5c on the dielectric layer 2c. The output capacitor electrodes 10a and 10b have connection leads 12a and 12b extending toward each other.

The dielectric layer 2e located above the dielectric layer 2f is formed at a position opposing to the input capacitor electrode 9 with a second grounding electrode 13. The second grounding electrode 13 is larger in size than the input capacitor electrode 9 and located to cover overall area of the input capacitor electrode 9. The second grounding electrode 13 is formed at a position vertically aligned with the external connection leads 8b and 8c on the base dielectric layer 2g with external connection leads 13a and 13b which extend to an edge portion of the layer 2e.

The dielectric layer 2e is further formed with balancing capacitor electrodes 14a and 14b at positions opposing respectively to the output capacitor electrodes 10a and 10b on the dielectric layer 2f. The balancing capacitor electrodes 14a and 14b are smaller in size respectively than the output capacitor electrode 10a and 10b and located so that they do not extend as seen in the vertical direction beyond the confines of the output capacitor electrodes 10a and 10b. The balancing capacitor electrodes are provided respectively with connection leads 15a and 15b which extend toward each other. In FIG. 2, it will be noted that the connection lead 15a of the balancing capacitor electrode 14a is connected with the connection lead 12b of the output capacitor electrode 10b to which the electrode 14a is not opposed. Similarly, the connection lead 15b of the balancing capacitor electrode 14b is connected with the connection lead 12a of the output capacitor electrode 10a to which the electrode 14b is not opposed.

It will be apparent from the above description the dielectric layer 2f provides the intermediate layer for the capacitor section 7 and the dielectric layer 2e provides the upper dielectric layer. The dielectric layer 2d functions as a separation layer between the coil section 2 and the capacitor section 7.

Figure 3A:
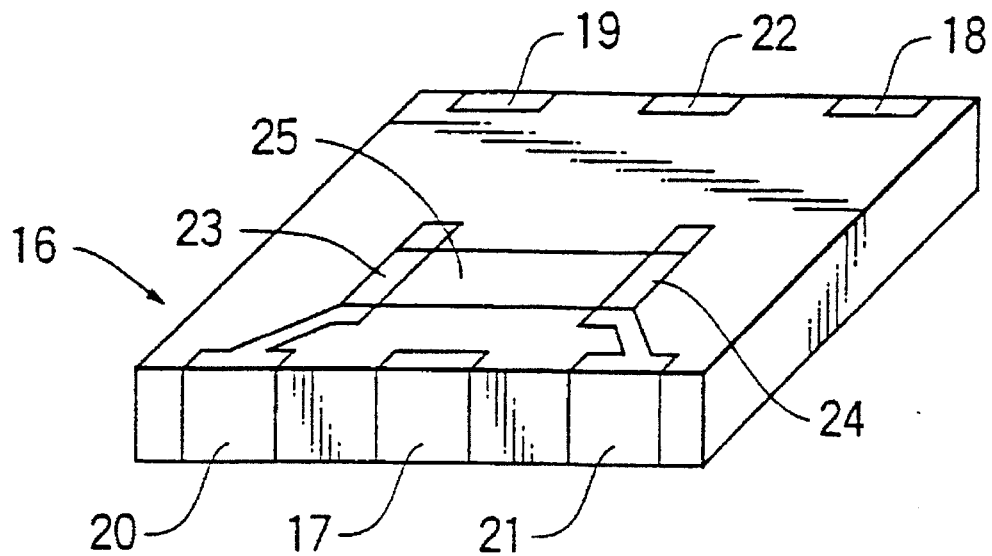
FIGS. 3(a) and 3(b) show perspective views respectively showing two different modes of the structure shown in FIGS. 1 and 2.
Figure 3B:
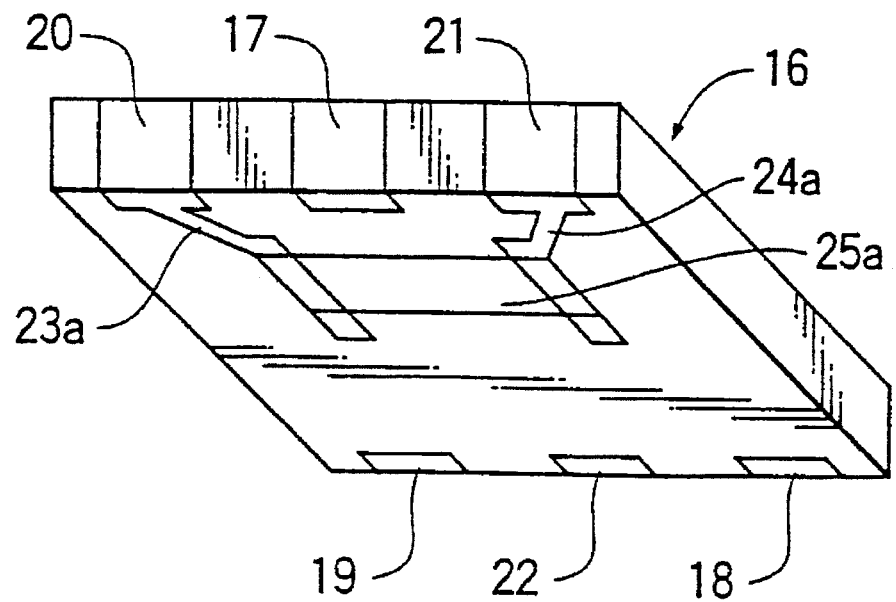

The dielectric layers 2a, 2b, 2c, 2d, 2e, 2f and 2g are laid one over the other and compacted to form a dielectric block 16. Desired conductive electrodes are provided on the outer surfaces of the dielectric block 16. Referring to FIGS. 3(a) and 3(b), it will be noted that the dielectric block 16 is formed at an end surface with a grounding terminal 17 which is located at a position corresponding to the connection lead 8a extending to the edge of the base dielectric layer 2g and connected with the lead 8a. On the opposite end surface of the dielectric block 16, there are provided grounding terminals 18 and 19 at positions corresponding to the connection leads 8b and 8c extending to the edge potion of the base dielectric layer 2g and the connection leads 13a and 13b extending from the second grounding electrode 13 to the edge potion of the dielectric layer 2e. The grounding terminals 18 and 19 are connected with the connection leads 8b, 8c, 13a and 13b.

The dielectric block 16 is formed at the end portion with output terminals 20 and 21 which are located at the opposite sides of the grounding electrode 17 at locations corresponding to the output terminal connection leads 11a and 11b and connected with the connecting leads 4c and 5c, respectively, and the connection leads 11a and 11b, respectively. Between the connection leads 18 and 19, there is formed an input terminal 22 which is located at a position corresponding to the input terminal connection lead 6 on the dielectric layer 2b and the input terminal connection lead 9a on the dielectric layer 2f and connected with the connection leads 6 and 9a.

Figure 4:
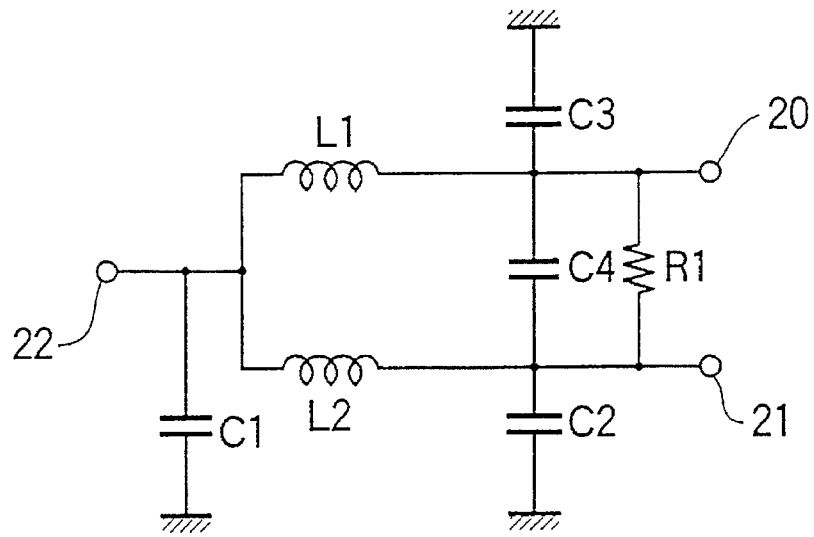
FIG. 4 is a circuit diagram of the high frequency signal dividing and/or coupling device in accordance with the embodiment shown in FIGS. 1 through 3(b)

The high frequency signal dividing and/or coupling device in accordance with this embodiment provides a circuit as shown in the circuit diagram of FIG. 4. The coil L1 is provided by the coil portions 4a and 4b, whereas the coil L2 is provided by the coil portions 5a and 5b. The capacitor C1 is provided by a capacitance C11 formed between the grounding electrode 13 on the upper dielectric layer 2e of the capacitor section 7 and the input capacitor electrode 9 on the intermediate layer 2f, and a capacitance C12 formed between the grounding electrode 8 of the base dielectric layer 2g and the input capacitor electrode 9 of the intermediate dielectric layer 2f. The capacitor C2 is provided by a capacitance between the grounding electrode 8 of the base dielectric layer 2g and the output capacitor electrode 10a on the intermediate dielectric layer 2f. The capacitor C3 is provided by a capacitance C3 between the grounding electrode 8 on the base dielectric layer 2g and the output capacitor electrode 10b on the intermediate layer 2f. The capacitor C4 is provided by capacitances C41 and C42 formed respectively between the output capacitor electrodes 10a and 10b on the intermediate dielectric layer 2f and the balancing capacitor electrodes 14a and 14b on the upper dielectric layer 2e.

In the embodiment being discussed, the resistor R1 is formed as shown in FIGS. 3(a) and 3(b) on an outer surface of the dielectric block 16. In the example shown in FIG. 3(a), the dielectric block 16 is formed on the upper surface with connection leads 23 and 24 extending from the output terminals 20 and 21 and a resistor 25 is formed between the connection leads 23 and 24. In the example shown in FIG. 3(b), the dielectric block 16 is formed on the lower surface with connection leads 23a and 24a extending from the output terminals 20 and 21, respectively, and a resistor 25a is formed between the connection leads 23a and 24a. Needless to say, the dielectric block 16 formed by the laminated green sheets is subjected to a sintering process at an appropriate time before or after the external conductors are formed under a predetermined sintering condition to provide a dielectric block of sintered ceramic. Reference may be made to the aforementioned Japanese patent application for the sintering conditions. It should further be noted that the resistor R1 may be in the form of a resistor separately prepared from the dielectric block 16 and assembled to the block afterwards to be connected between the output terminals 20 and 21. When preferred, the resistor R1 may be formed on an appropriate layer in the dielectric block 16.

Figure 5:
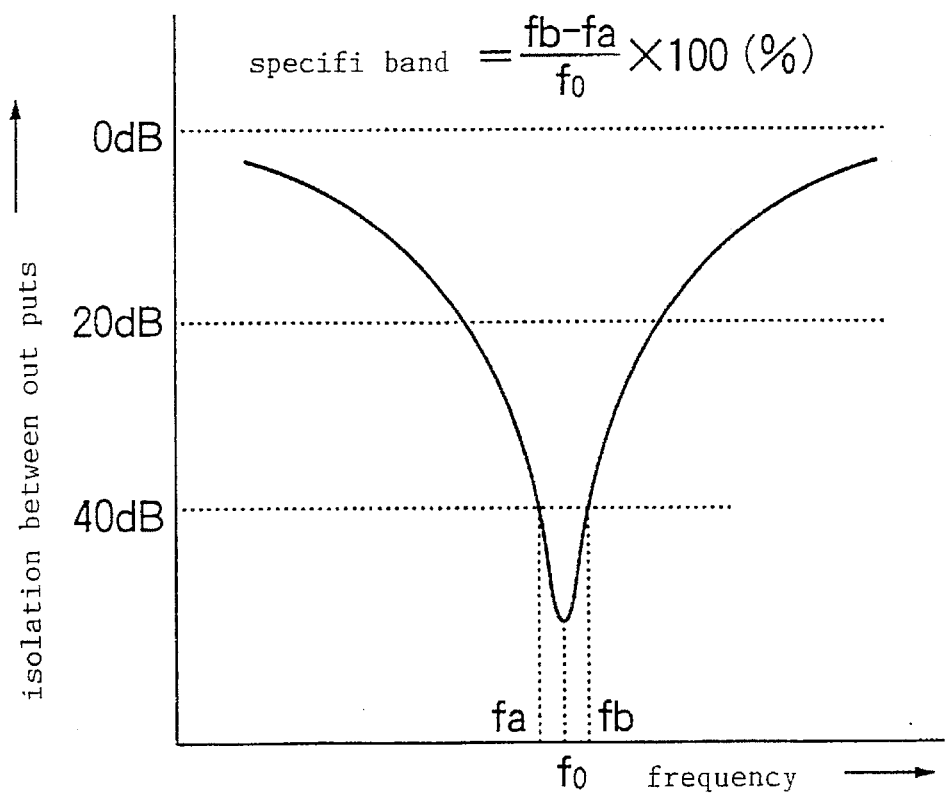
FIG. 5 is a diagram showing the isolation property between the outputs in the device of the aforementioned embodiment used as a high frequency signal dividing device.

In FIG. 5, there is shown the isolation property between two outputs in the circuit structured in accordance with the embodiment of the present invention. Representing the center frequency by $f_0$ and the frequencies under which the isolation between the outputs becomes 40 dB by $f_a$ and $f_b$, a specific band is defined by $[(f_b-f_a)/f_0]\times 100\%$. It will be noted that the specific band is smaller under the output isolation of 40 dB than under 20 dB so that a severe manufacturing tolerance is required in the isolation of 40 dB. In the structure of the aforementioned embodiment, the dividing and/or coupling device can be manufactured without any problem.

Figure 6:
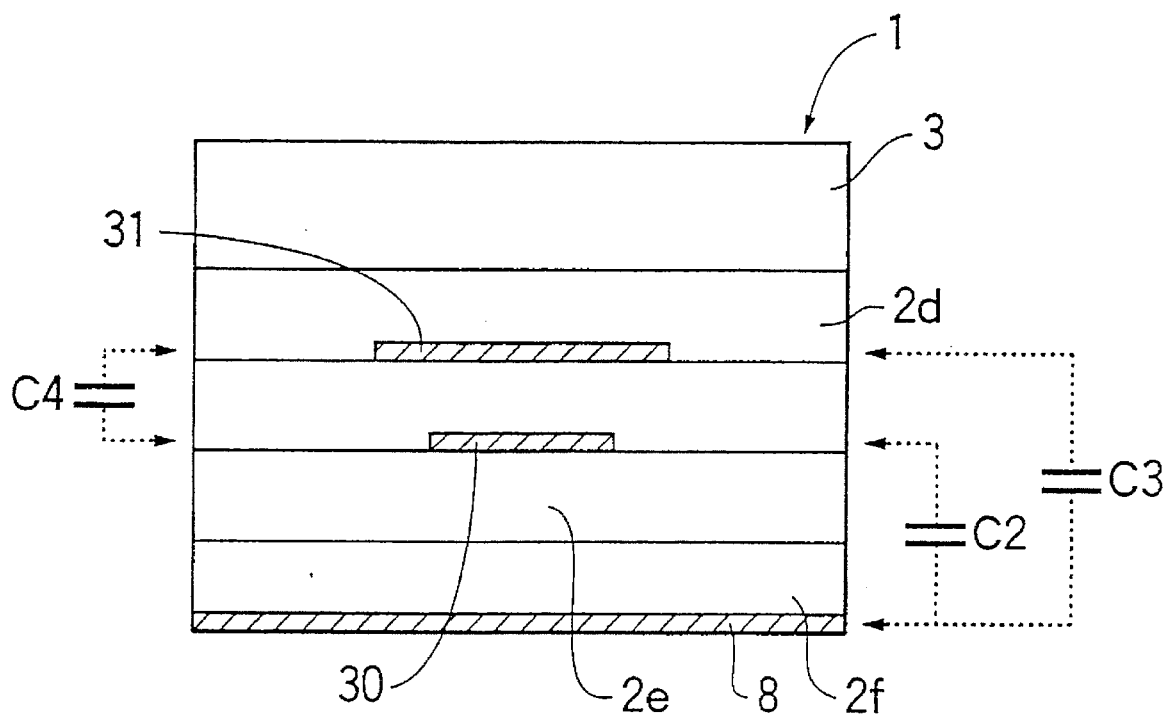
FIG. 6 is a sectional view similar to FIG. 1 but showing another embodiment.
Figure 7:
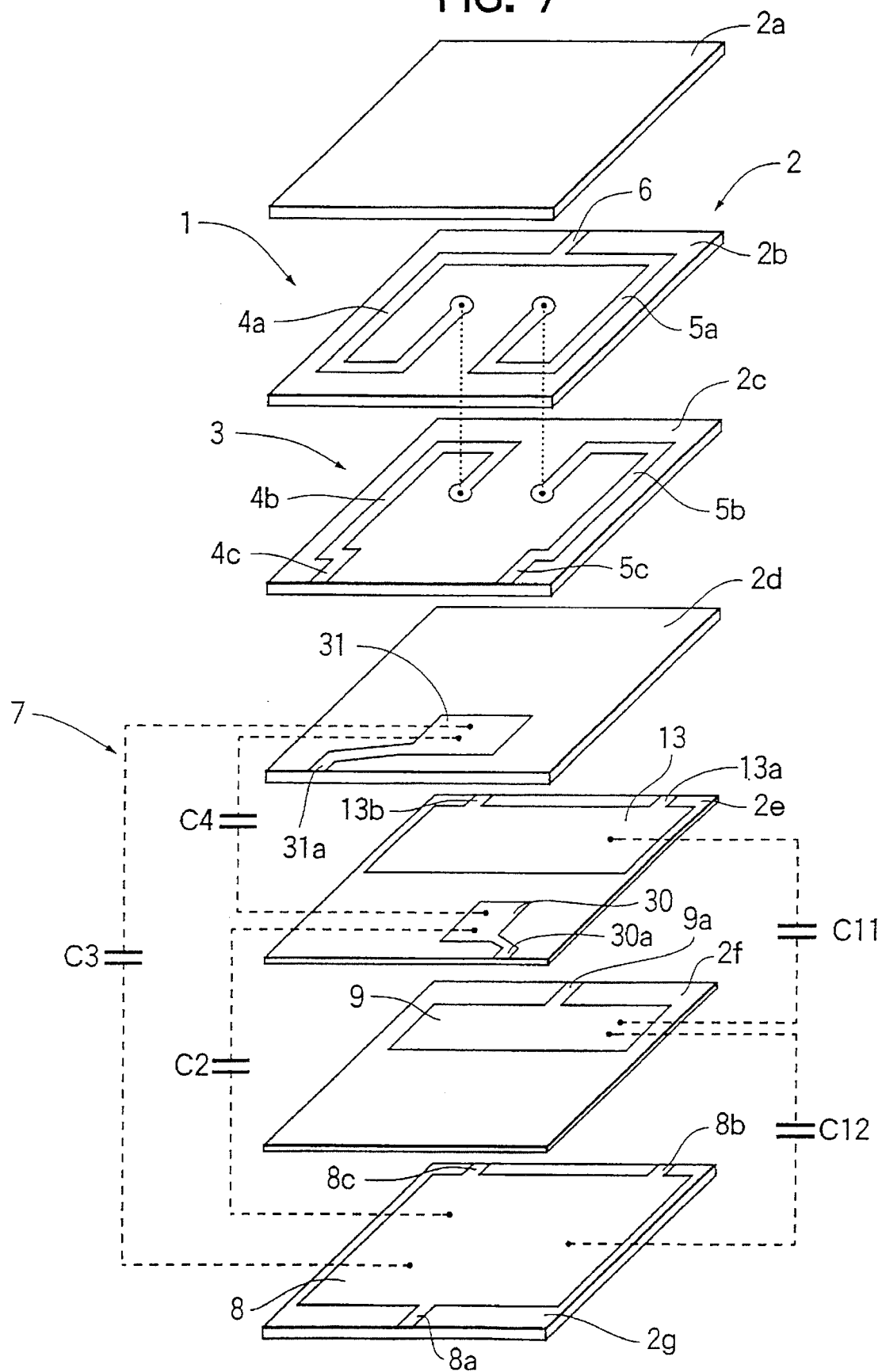
FIG. 7 is an exploded perspective view showing details of the structure of the high frequency signal dividing and/or coupling device in accordance with the embodiment of FIG. 6.

Referring now to FIGS. 6 and 7, the embodiment shown therein has a coil section 3 which is the same as in the previous embodiment. Therefore, corresponding parts are designated by the same references and detailed description will be omitted. Further, in this embodiment, the dielectric layers are of seven layer structure so that the layers are also designated by the same references. Corresponding parts are also shown by the same references as in the previous embodiment.

In this embodiment, the lowermost base dielectric layer 2g in the dielectric layers providing a capacitor section 7 is formed with a grounding electrode 8 having connection leads 8a, 8b and 8c as in the previous embodiment. The capacitor section 7 is made of dielectric layers 2d, 2e and 2f in addition to the base dielectric layer 2g. It will therefore be noted that the dielectric layer 2d provides the upper dielectric layer, the dielectric layer 2f provides the first intermediate layer and the dielectric layer 2e provides the second intermediate layer. The first intermediate layer 2f is formed with an input capacitor electrode 9 having a connection lead 9a. The configuration and the arrangement of the input capacitor electrode 9 are the same as those in the previous embodiment. The second intermediate dielectric layer 2e is formed at a position opposing to the input capacitor electrode 9 on the layer 2f with a second grounding electrode 13. The configuration and the arrangement of the second grounding electrode 13 are also the same as in the previous embodiment and has connection leads 13a and 13b.

The second intermediate dielectric layer 2e is further formed with an output capacitor electrode 30. The output capacitor electrode 30 has an output terminal connection lead 30a extending to an edge of the dielectric layer 2e. The upper dielectric layer 2d is formed at a position vertically aligned with the output capacitor electrode 30 with a second output capacitor electrode 31 which also functions as a capacitor electrode. The second output capacitor electrode 31 which also functions as the capacitor electrode is larger than the output capacitor electrode 30 and has a region as seen in the vertical direction extending beyond the confines of the output capacitor electrode 30. The second output capacitor electrode 31 has an output terminal connection lead 31a which extends to an edge of the dielectric layer 2d. The second output capacitor electrode 31 is located as seen in the vertical direction between the coil connection leads 4c and 5c formed in the dielectric layer 2c of the coil section 3.

In this embodiment, the output terminal connection lead 30a of the output capacitor electrode 30 is connected with the output terminal 21 shown in FIG. 3(a), and the output terminal connection lead 31a of the second output capacitor electrode 31 is connected with the output terminal 20. In this structure, an output grounding capacitor C2 is provided by a capacitance between the output capacitor electrode 30 and grounding electrode 8 on the base dielectric layer 2g, and an output grounding capacitor C3 is provided by a capacitance between the portion of the second output capacitor electrode 31 extending beyond the confine of the output capacitor electrode 30 and the grounding electrode 8. The areas of the electrodes 30 and 31 and the thicknesses of the dielectric layers 2e and 2f are determined so that the output grounding capacitors C2 and C3 have substantially equal capacitance. The capacitor C4 is provided by the capacitance between the electrodes 30 and 31.

Figure 8:
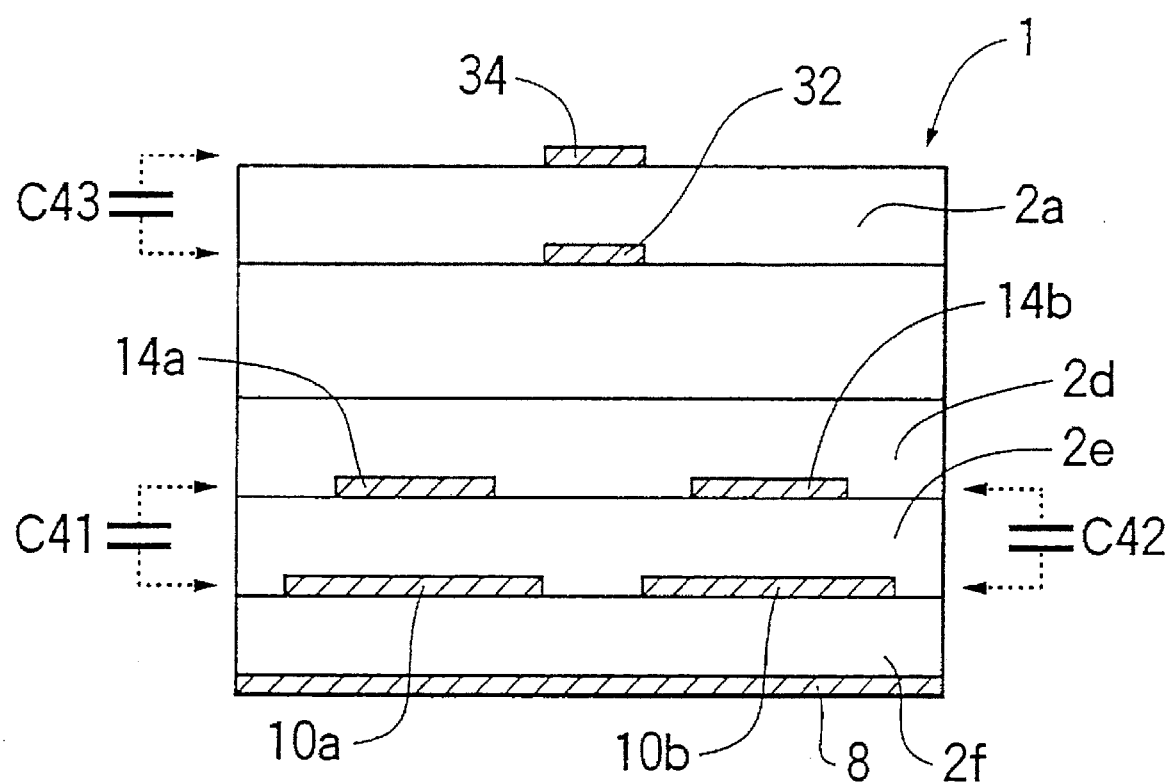
FIG. 8 is a sectional view similar to FIGS. 1 and 6 but showing a further embodiment of the present invention.
Figure 9:
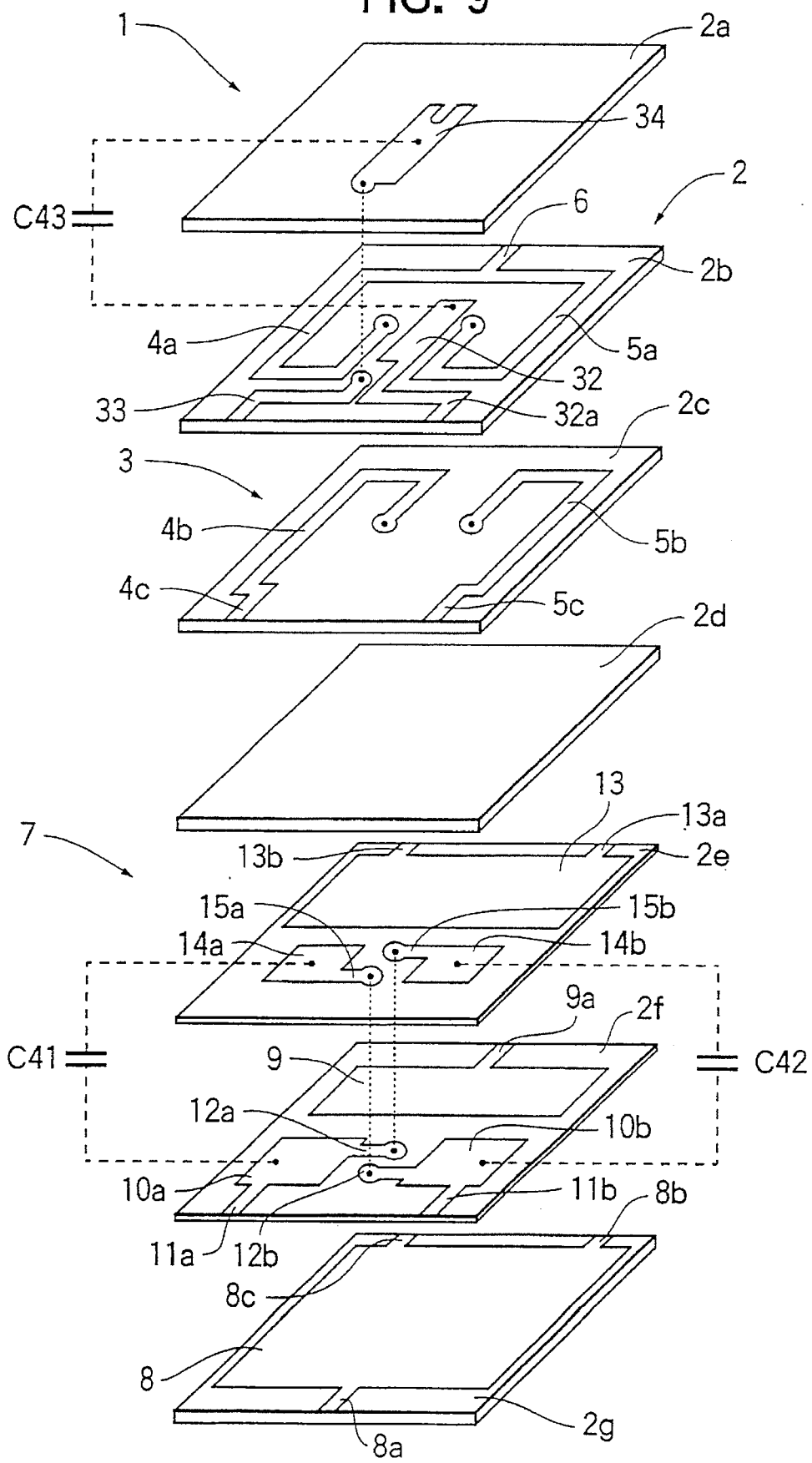
FIG. 9 is an exploded perspective view showing the details of the structure of the high frequency signal dividing and/or coupling device in accordance with the embodiment shown in FIG. 8.

Referring to FIGS. 8 and 9, there is shown a further embodiment which is substantially the same as the embodiment shown in FIGS. 1 through 4. Therefore, corresponding parts are designated by the same references and the detailed description will be omitted. In this embodiment, the dielectric layer which is the second from top, that is, the upper dielectric layer 2b of the coil section 3 is formed with a capacitor electrode 32. The electrode 32 is located between the coil portions 4a and 5a. The electrode 32 is formed with an output terminal connection lead 32a which is located in a position as seen in the vertical direction to be aligned with the output terminal connection lead 11b on the dielectric layer 2f and extends to an edge of the dielectric layer 2b. The dielectric layer 2b is further formed with an output terminal connection lead 33 which extends to an edge of the dielectric layer 2c at a location aligned in the vertical direction with the output terminal connection lead 11a on the dielectric layer 2f.

The uppermost dielectric layer 2a is formed with a second capacitor electrode 34. The electrode 34 is connected at one end in the vertical direction with the output terminal connection lead 33 on the dielectric layer 2b. The dielectric layers 2a . . . 2g are laid one over the other in the order shown in FIG. 2 and sintered after being compacted. The output terminals 33 and 32a extending to the edge portion of the dielectric layer 2b are connected with the output terminals 20 and 21, respectively, together with the output terminal connection leads 11a and 11b.

In this embodiment, the capacitance between the capacitor electrode 32 on the dielectric layer 2b and the capacitor electrode 34 on the uppermost dielectric layer 2a provides a portion C43 of the balance capacitor C4 which is connected between the paired output terminals. The remaining capacitances C41 and C42 are provided respectively between the electrodes 10a and 14a and between the electrodes 10b and 14b. In this embodiment, it is possible to adjust the capacitance of the capacitor C4 through an appropriate trimming of the capacitor electrode 34 on the uppermost dielectric layer 2a.

Figure 10:
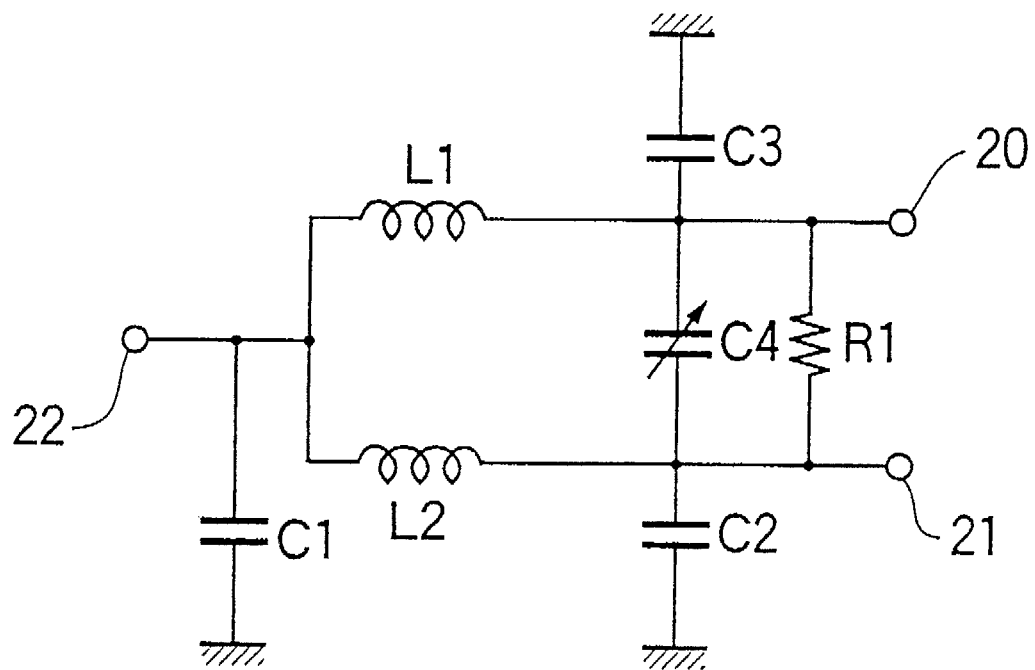
FIG. 10 is a circuit diagram of the high frequency signal dividing and/or coupling device in accordance with the embodiment shown in FIGS. 8 and 9.

FIG. 10 shows the circuit diagram of the embodiment of FIGS. 8 and 9. The capacitor C4 between the output terminals 20 and 21 can be considered as a variable capacitor as shown.

Figure 11:
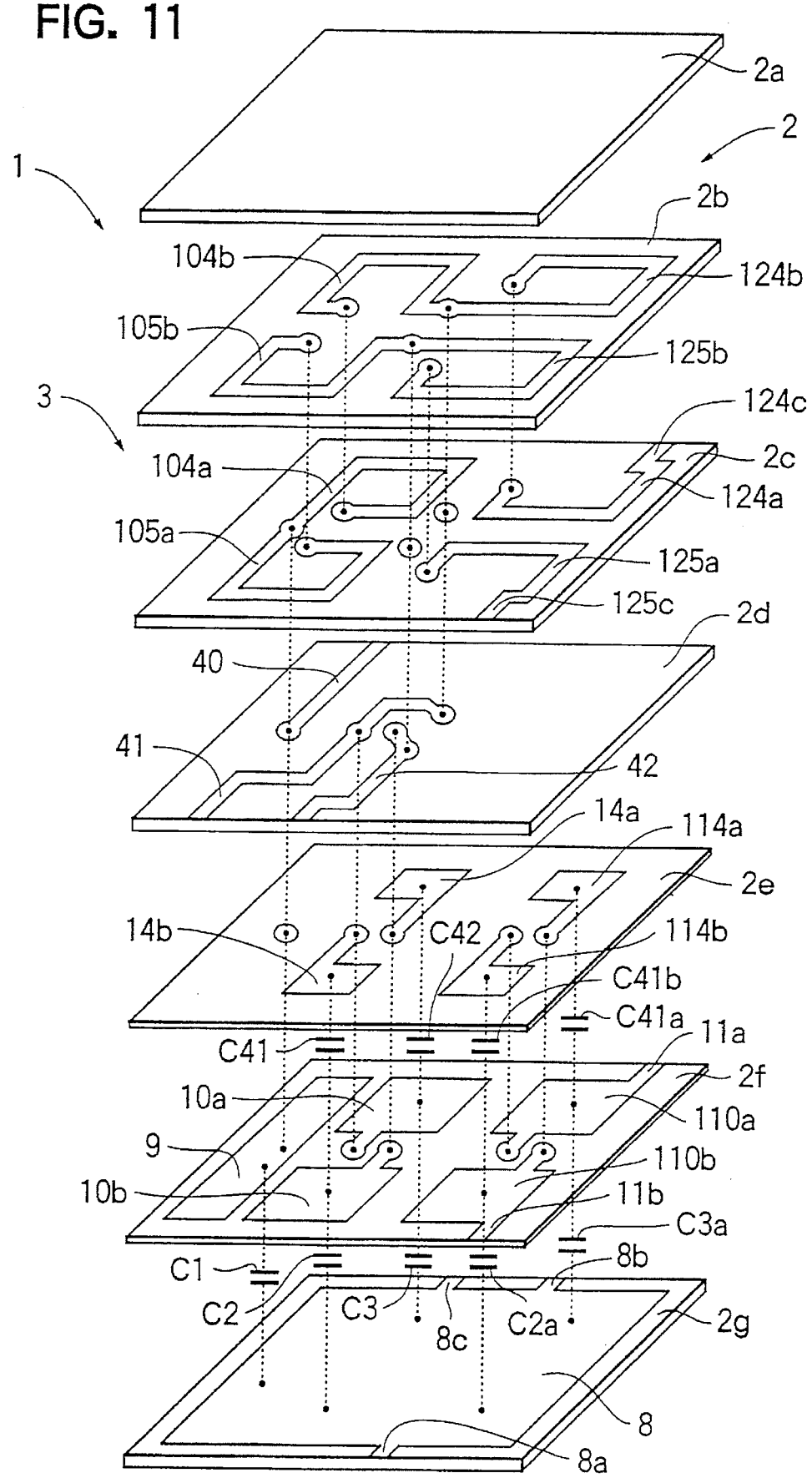
FIG. 11 is an exploded perspective view showing a high frequency signal dividing and/or coupling device in accordance with still further embodiment of the present invention.
Figure 12:
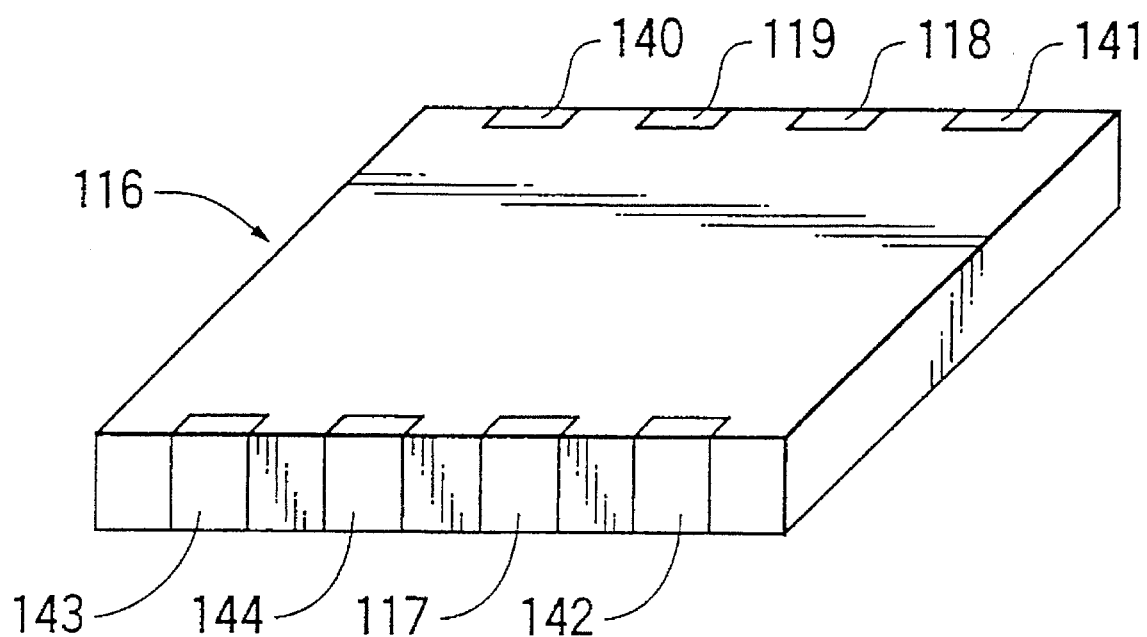
FIG. 12 is a perspective view showing the external appearance of the high frequency signal dividing and/or coupling device in accordance with the embodiment shown in FIG. 11.
Figure 13:
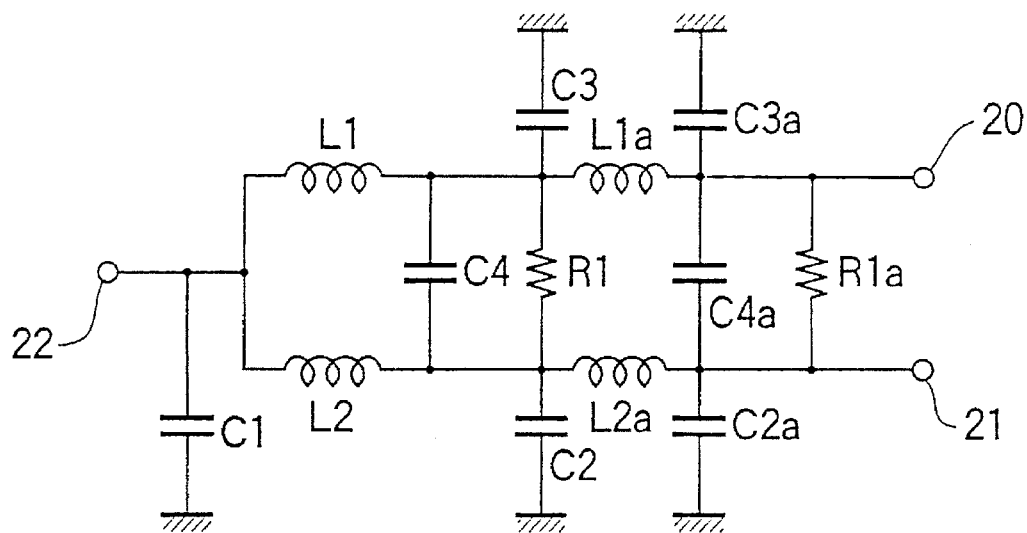
FIG. 13 shows a circuit diagram of the high frequency signal dividing and/or coupling device in accordance with the embodiment shown in FIGS. 11 and 12; and, FIG. 14 is a diagram showing the isolation property between the outputs in the structure in accordance with the embodiment shown in FIGS. 11 through 13.

Referring now to FIGS. 11 and 12, there is shown an embodiment in the form of a dividing and/or coupling device of a structure having a circuit shown by a circuit diagram in FIG. 13. In FIG. 13, a pair of coils L1 and L2 are connected as in the previous embodiment with the output capacitors C3 and C2, the capacitor C4 and the resistor R1. Second coils L1a and L2a are provided and connected in series with the coils L1 and L2, respectively, and the second coils L2a and L2a are connected respectively with the output terminals 20 and 21. Output grounding capacitors C3a and C2a are connected with the output terminals 20 and 21, respectively, and a capacitor C4a and a resistor R1a are connected between the output terminals 20 and 21. The circuit is of a two stage type wherein the circuits of the type shown in FIG. 4 are connected in two stages.

Referring to FIG. 11, the lowermost dielectric layer 2g is formed with a grounding electrode 8 having connection leads 8a, 8b and 8c as in the previous embodiments. The dielectric layer 2f above the layer 2g is formed with an input capacitor electrode 9 which is located to be opposed to a portion of the grounding electrode 8 for providing an electrode for the input capacitor. In the remaining portion of the dielectric layer 2f, there are formed a pair of output capacitor electrodes 10a and 10b for providing electrodes for the output grounding capacitors C3 and C2, and a pair of output capacitor electrodes 110a and 110b for providing electrodes for the output capacitors C3a and C2a, respectively. The output capacitor electrodes 110a and 110b respectively have output terminal connection leads 11a and 11b extending to the opposite edge portions of the dielectric layer 2f.

In the further upper dielectric layer 2e is formed at positions vertically aligned with the output capacitor electrodes 10a and 10b, respectively, with capacitor electrodes 14a and 14b, and at positions vertically aligned with the output capacitor electrodes 110a and 110b, respectively, with capacitor electrodes 114a and 114b. In the dielectric layer 2d above the dielectric layer 2e, there are formed an input terminal connection lead 40 extending to an edge portion of the dielectric layer 2d and a pair of tap connections 41 and 42 extending in the direction opposite to the input terminal connection lead 40.

Referring to the dielectric layers 2b and 2c defining the coil section 3, the dielectric layer 2c is formed with coil portions 104a and 105a which provide portions of the coils L1 and L2. The coil portions 104a and 105a are connected at one of their ends with each other, and the connected ends are in turn connected with the input connection lead 40 on the dielectric layer 2d. The input terminal connection lead 40 is also connected through the dielectric layer 2e with the input capacitor electrode 9 on the dielectric layer 2f. The dielectric layer 2c is further formed with coil portions 124a and 125a which provide portions of the coils L1a and L2a. The coil portions 124a and 125a is provided at one ends with output terminal connection leads 124c and 125c extending to an edge portion of the dielectric layer 2c.

In the dielectric layer 2b above the dielectric layer 2c, there are formed coil portions 104b and 105b which provide portions of the coils L1 and L2, and coil portions 124b and 125b which provide portions of the coils L1a and L2a. The coil portions 104b and 124b are connected at one ends with each other and the connected ends are in turn connected through the dielectric layer 2c with the tap connection 41 on the dielectric layer 2d. Similarly, the coil portions 105b and 125b are connected at one ends with each other and the connected ends are connected through the dielectric layer 2c with the tap connection 42 on the dielectric layer 2d. The other end of the coil portion 104b is connected with the other end of the coil portion 104a on the lower dielectric layer 2c, and the other end of the coil portion 105b is connected with the other end of the coil portion 105a on the lower dielectric layer 2c. The other end of the coil portion 124b is connected with the other end of the coil portion 124a on the lower dielectric layer 2c, and the other end of the coil portion 125b is connected with the other end of the coil portion 125a on the lower dielectric layer 2c.

The above described dielectric layers the are laid one over the other and sintered after being compacted to form a sintered dielectric block 116. The dielectric block 116 is formed on the outer end surface with an input terminal 140 connected with the input terminal connection lead 40, grounding terminals 117, 118 and 119 respectively connected with the connection leads 8a, 8b and 8c of the grounding electrode 8, an output terminal 141 connected with the output terminal connection lead 124c and the output terminal connection lead 11a, an output terminal 142 connected with the output terminal connection lead 125c and the output terminal connection lead 11b, and tap terminals 143 and 144 connected respectively with tap connections 41 and 42.

In the structure of this embodiment, the input grounding capacitor C1 is provided by a capacitance between the electrodes 9 and 8. The output grounding capacitors C2 and C3 are provided by capacitances between the grounding electrode 8 and the electrodes 10b and 10a, respectively. The capacitor C4 is provided by a capacitance C41 between the electrodes 10a and 14a and a capacitance C42 between the electrodes 10b and 14b. The capacitor C4a is provided by a capacitance C41a between the electrodes 110a and 114a and a capacitance C41b between the electrodes 110b and 114b. For the purpose, as in the embodiment shown in FIGS. 1 through 3, the electrode 10a is connected with the electrode 14b, and the electrode 10b is connected with the electrode 14a, respectively. Further, the electrode 110a is connected with the electrode 114b, and the electrode 110b is connected with the electrode 114a, respectively. The electrode 14a is connected with the tap connection 42 and the electrode 14b is connected with the tap connection 41.

In this embodiment, the electrodes 14a and 14b are smaller than the electrodes 10a and 10b, respectively, and located so that they do not extend beyond the confines of the electrodes 10a and 10b, respectively, as seen in the vertical direction. Similarly, the electrodes 114a and 114b are smaller than the electrodes 110a and 110b, respectively, and located so that they do not extend beyond the confines of the electrodes 110a and 110b, respectively, as seen in the vertical direction.

Figure 14:
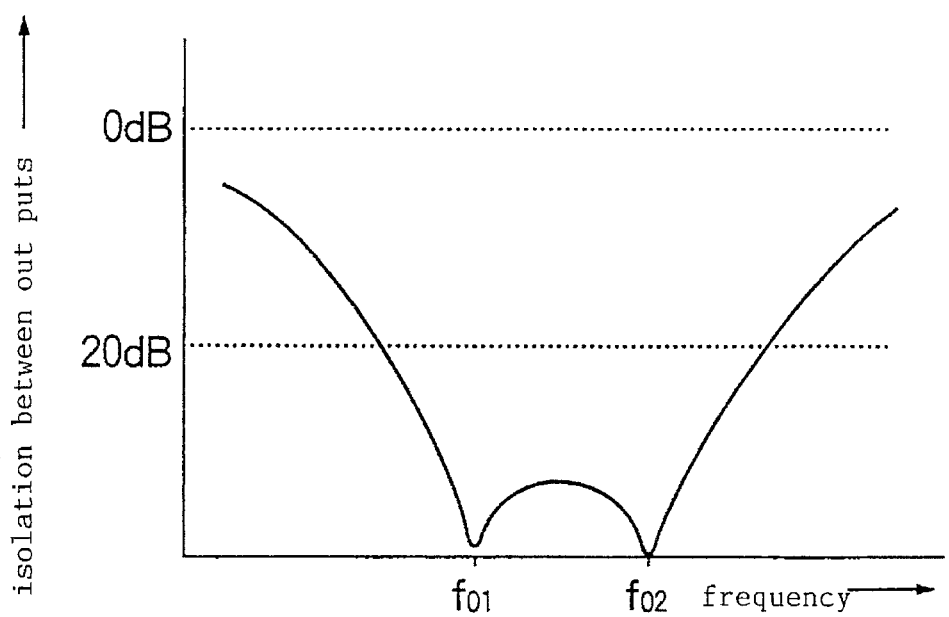

FIG. 14 shows the isolation property between the two outputs of the circuit of this embodiment. By having the center frequency $f_{o1}$ of the first stage composed of the coils L1 and L2 deviated from the center frequency $f_{o2}$ of the second stage composed of the coils L1a and L2a as shown, it is possible to broaden the overall isolation between the two outputs so that the isolation property can be improved.

The invention has thus been shown and described with reference to specific embodiments, however, it should be noted that the invention is in no way limited to the structures and the functions of the embodiments.

I claim:

1. A high frequency signal dividing and/or coupling device comprising a circuit formed in a laminated, sintered dielectric block, said circuit including at least an input terminal grounded through an input grounding capacitor, a pair of output terminals grounded respectively through output grounding capacitors, a coil connected between said input terminal and each of said pair of output terminals, and a capacitor connected between said output terminals;

said coils being formed in a coil section having at least one dielectric layer having coil patterns formed thereon;

said capacitors being formed in a capacitor section comprising;

a base dielectric layer having a grounding electrode pattern providing a common grounding electrode for said input grounding capacitor and said grounding output capacitors;

an intermediate dielectric layer located over said base dielectric layer to cover said grounding electrode pattern and having a pair of output capacitor electrode patterns of identical configuration for providing electrodes for said pair of output grounding capacitors and an input capacitor electrode pattern for providing an electrode for the input grounding capacitor, said capacitor electrode patterns being located to be opposed to said grounding electrode pattern on said base dielectric layer;

an upper dielectric layer located over said intermediate dielectric layer to cover said capacitor electrode patterns and having first and second balancing electrode patterns of divided identical configuration located in positions to be opposed to said output capacitor electrode patterns on said intermediate dielectric layer for providing electrodes for the capacitor connected between said output terminals and a grounding electrode pattern located in a position to be opposed to said input capacitor pattern on said intermediate dielectric layer for providing a second grounding electrode;

said coil section and said capacitor section being laid one over the other to form the sintered integral block.

2. A high frequency signal dividing and/or coupling device in accordance with claim 1 wherein said pair of output capacitor electrode patterns of identical configuration on said intermediate dielectric layer are connected with a pair of output terminals formed on an outer surface of the block.

3. A high frequency signal dividing and/or coupling device in accordance with one of claim 1 wherein said input capacitor electrode pattern on said intermediate dielectric layer is connected with an input terminal formed on an outer surface of said block.

4. A high frequency signal dividing and/or coupling device in accordance with claim 1 wherein said divided first and second capacitor electrode patterns on said upper dielectric layer are connected with the output capacitor electrode patterns to which the capacitor electrode patterns are not opposed.

5. A high frequency signal dividing and/or coupling device in accordance with claim 1 wherein said grounding electrode patterns on said base and upper dielectric layers are both connected with a grounding electrode formed on an outer surface of said block.

6. A high frequency signal dividing and/or coupling device in accordance with claim 1 wherein said pair of output capacitor electrode patterns are located symmetrically with respect to a center line in the plane of said intermediate dielectric layer.

7. A high frequency signal dividing and/or coupling device in accordance with claim 6 wherein said first and second capacitor electrode patterns are located symmetrically with respect to a center line in the plane of said upper dielectric layer.

8. A high frequency signal dividing and/or coupling device in accordance with claim 1 wherein said capacitor electrode patterns are smaller than said output capacitor electrode patterns and located so that they do not extend beyond confines of said output capacitor electrode patterns.

9. A high frequency signal dividing and/or coupling device in accordance with claim 1 wherein an outer surface of an outermost dielectric layer and an inner dielectric layer are formed with electrodes which are opposed to each other, one of said electrodes being connected with one of the output terminals and the other of said electrodes being connected with the other output terminal for providing a part of a capacitance of said capacitor.

10. A high frequency signal dividing and/or coupling device comprising a circuit formed in a laminated, sintered dielectric block, said circuit including at least an input terminal grounded through an input grounding capacitor, a pair of output terminals grounded respectively through output grounding capacitors, a coil connected between said input terminal and each of said pair of output terminals, and a capacitor connected between said output terminals;

said coils being formed in a coil section having at least one dielectric layer having coil patterns formed thereon;

said capacitors being formed in a capacitor section comprising;

a base dielectric layer having a grounding electrode pattern providing a common grounding electrode for said input grounding capacitor and said grounding output capacitors;

a first intermediate dielectric layer located over said base dielectric layer and having an input capacitor electrode located in a position to be opposed to a portion of said grounding electrode pattern for providing an electrode for said grounding capacitor electrode;

a second intermediate dielectric layer located over said first intermediate dielectric layer having a second grounding electrode pattern of a size larger than said input capacitor electrode pattern formed in a position to be opposed to said input capacitor electrode pattern and an output capacitor electrode pattern formed in a position wherein the output capacitor electrode pattern is not opposed to said input capacitor electrode pattern for providing an electrode for one of the output grounding capacitors; and, an upper dielectric layer located over said second intermediate layer and having a second output capacitor electrode pattern formed in a position to be opposed to said output capacitor electrode on said second intermediate dielectric layer, said second output capacitor electrode pattern being larger in size than said output capacitor electrode pattern on said second intermediate dielectric layer so as to have a portion extending beyond confine of said output capacitor electrode pattern on said second intermediate dielectric layer as seen in a vertical direction;

said capacitor connected between said output terminals being defined by a capacitance between said output capacitor electrode pattern on said second intermediate dielectric layer and said second capacitor electrode pattern on said upper dielectric layer, said output grounding capacitor for one of the output terminals being defined between said output capacitor electrode pattern on said second intermediate dielectric layer and said grounding electrode pattern on said base dielectric layer, and said output grounding capacitor for the other of said output terminals being defined between the portion of said second output capacitor electrode pattern on said upper dielectric layer extending beyond the confine of said output capacitor electrode pattern on said second intermediate dielectric layer and said grounding electrode pattern on said base dielectric layer.

11. A high frequency signal dividing and/or coupling device in accordance with claim 10 wherein an outer surface of an outermost dielectric layer and an inner dielectric layer are formed with electrodes which are opposed to each other, one of said electrodes being connected with one of the output terminals and the other of said electrodes being connected with the other output terminal for providing a part of a capacitance of said capacitor connected between said output terminals.

12. A high frequency signal dividing and/or coupling device comprising a circuit formed in a laminated and sintered dielectric block, said circuit comprising an input terminal grounded through an input grounding capacitor, a pair of output terminals, at least two stages of coils including a first stage and second stage coils connected between said input terminal and each of said pair of output terminals, a first stage output grounding capacitor connected with each of said first stage coils, a first stage capacitor connected between the paired coils in the first stage, a second stage output grounding capacitor connected with each of said second stage coils, and a second stage capacitor connected between the paired coils in the second stage;

each said coil being formed in a coil section having at least one dielectric layer formed with conductive coil patterns;

said capacitors being formed in a capacitor section comprising;

a base dielectric layer formed with a grounding electrode pattern for providing a common grounding electrode for said input grounding capacitor and said first and second stages of the output grounding capacitors;

an intermediate dielectric layer laid over said base dielectric layer to cover said grounding electrode pattern and having a pair of first stage output capacitor electrode patterns of identical configuration for providing electrodes for the pair of the first stage output capacitors, a pair of second stage output capacitor electrode patterns of identical configuration for providing electrodes of the pair of the second stage output grounding capacitors, and an input capacitor electrode pattern for providing an electrode for the input grounding capacitor, the first and second stages output capacitor electrode patterns and the input grounding electrode pattern being located to be opposed to said grounding electrode pattern on said base dielectric layer; and, an upper dielectric layer laid over said intermediate dielectric layer to cover said capacitor electrode patterns and having two divided first stage capacitor electrode patterns of identical configuration formed in a position opposing to said first stage output capacitor electrode patterns on said intermediate dielectric layer for providing electrodes for the first stage output capacitors, two divided second stage capacitor electrode patterns of identical configuration formed in a position opposing to said second stage output capacitor electrode patterns for providing electrodes for the second stage output capacitors, and a grounding electrode pattern formed in a position opposing to said input capacitor electrode pattern on said intermediate dielectric layer for providing a second grounding electrode;

said coil section and said capacitor section being laid one over the other and sintered to provide an integral block.

13. A high frequency signal dividing and coupling device in accordance with claim 12 wherein said first stage balancing capacitor electrode pattern is smaller in size then said first stage output capacitor electrode pattern to which it is opposed so that it does not extend beyond confine of said first stage capacitor electrode pattern as seen in a vertical direction.

14. A high frequency signal dividing and coupling device in accordance with claim 12 wherein said second stage balancing capacitor electrode pattern is smaller in size then said second stage output capacitor electrode pattern to which it is opposed so that it does not extend beyond confine of said second stage capacitor electrode pattern as seen in a vertical direction.

15. A high frequency signal dividing and coupling device in accordance with claim 12 wherein said coil section is formed with a tap connection extending from the connection between the first and second stage coils to an external portion of the dielectric block, the tap connection having a tap terminal formed on an outer surface of said dielectric block.

* * * * *